(12) United States Patent
Sung et al.

(10) Patent No.: US 10,403,738 B1
(45) Date of Patent: Sep. 3, 2019

(54) TECHNIQUES FOR IMPROVED SPACER IN NANOSHEET DEVICE

(71) Applicant: Varian Semiconductor Equipment Associates, Inc., Gloucester, MA (US)

(72) Inventors: Min Gyu Sung, Essex, MA (US); Rajesh Prasad, Lexington, MA (US); John Hautala, Beverly, MA (US); Sony Varghese, Manchester, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 16/040,718

(22) Filed: Jul. 20, 2018

(51) Int. Cl.
| | |
|---|---|
| *H01L 29/66* | (2006.01) |
| *H01L 21/02* | (2006.01) |
| *H01L 29/786* | (2006.01) |
| *H01L 21/311* | (2006.01) |
| *H01L 29/06* | (2006.01) |
| *H01L 29/423* | (2006.01) |
| *H01L 21/3115* | (2006.01) |

(52) U.S. Cl.
CPC .... *H01L 29/66553* (2013.01); *H01L 21/0217* (2013.01); *H01L 21/02603* (2013.01); *H01L 21/31111* (2013.01); *H01L 21/31155* (2013.01); *H01L 29/0673* (2013.01); *H01L 29/42392* (2013.01); *H01L 29/66742* (2013.01); *H01L 29/78618* (2013.01); *H01L 29/78696* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,368,572 | B1 * | 6/2016 | Cheng | H01L 29/7827 |
| 2013/0341704 | A1 * | 12/2013 | Rachmady | H01L 29/66545 |
| | | | | 257/327 |
| 2016/0268375 | A1 * | 9/2016 | Chen | H01L 29/0673 |
| 2017/0053998 | A1 * | 2/2017 | Kim | H01L 29/42392 |
| 2017/0154973 | A1 * | 6/2017 | Ching | H01L 29/41791 |

* cited by examiner

*Primary Examiner* — Mamadou L Diallo

(57) ABSTRACT

Methods for forming three-dimensional transistor devices. In one embodiment a method of forming a three-dimensional transistor device may include providing a substrate comprising a semiconductor device structure, the semiconductor device structure comprising a nanowire stack, a gate stack disposed above the nanowire stack, and an inner spacer layer, disposed over the gate stack and the nanowire stack. The method may further include directing ions at the semiconductor device structure, wherein an altered layer is formed in a first part of the inner spacer layer, and an unaltered portion of the inner spacer layer remains, subjacent to the altered layer.

20 Claims, 7 Drawing Sheets

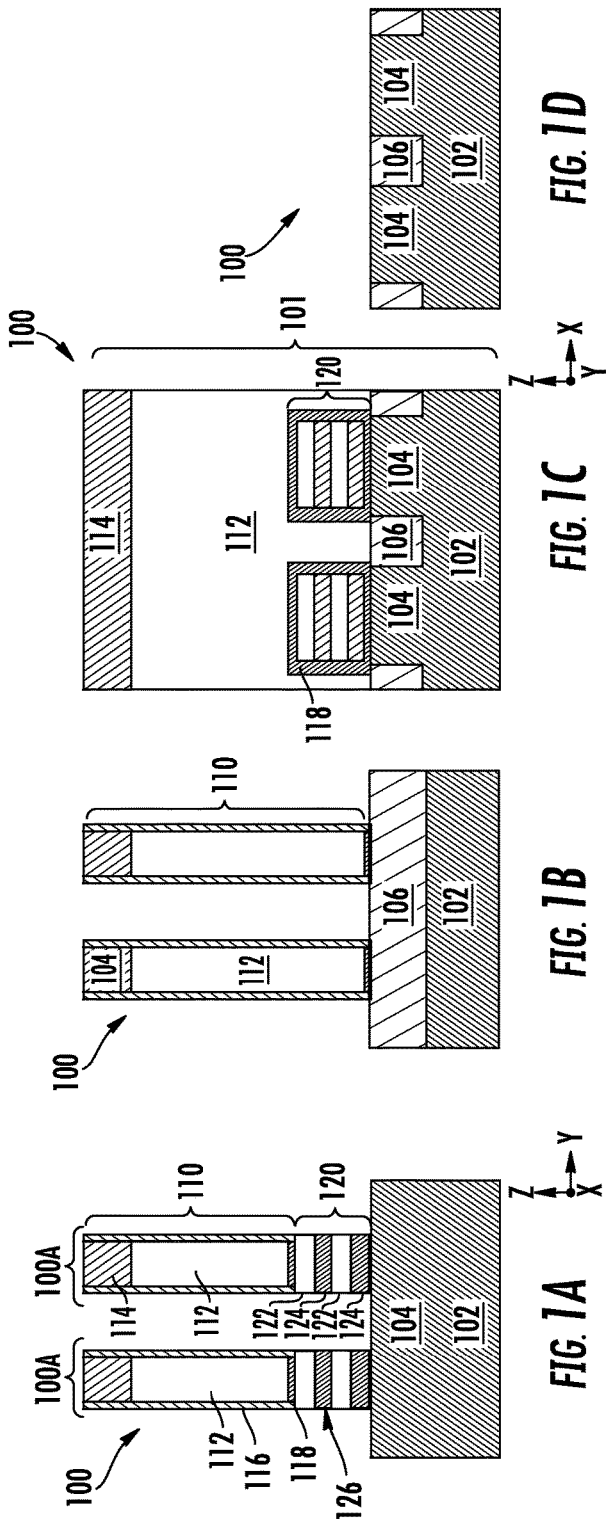

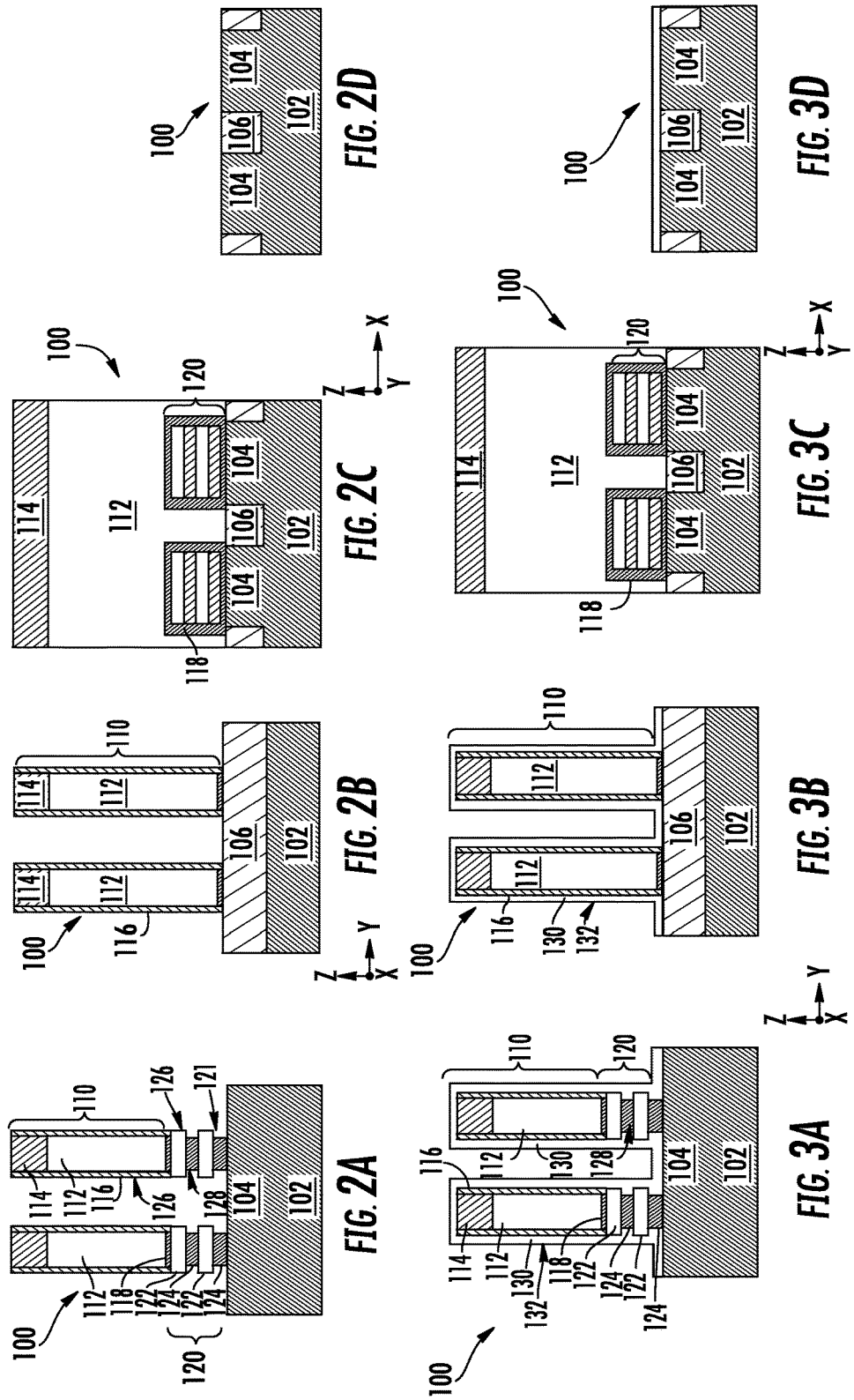

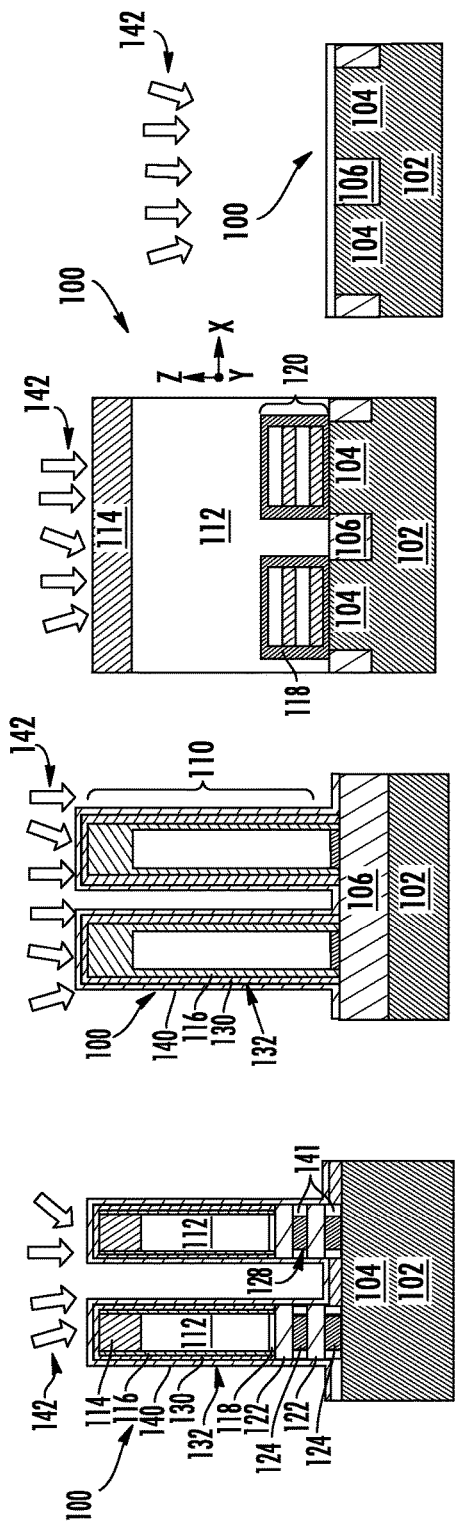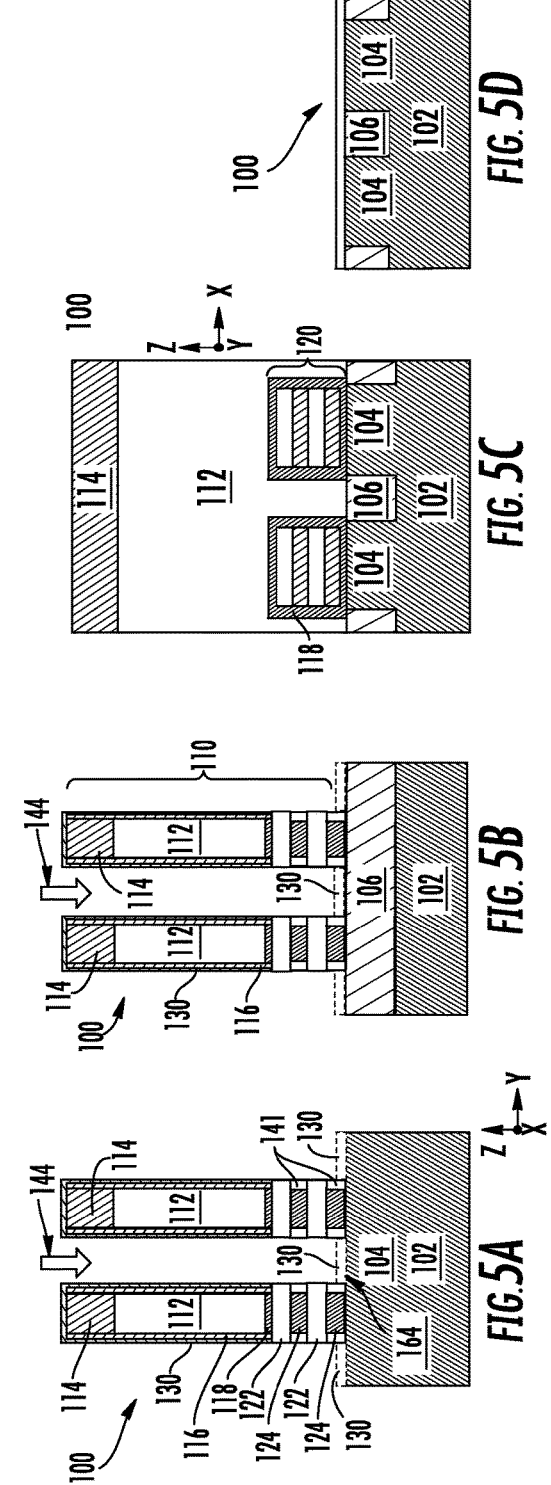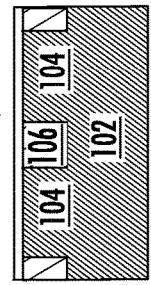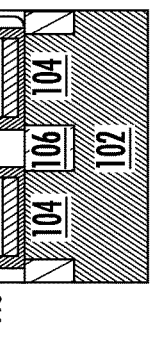

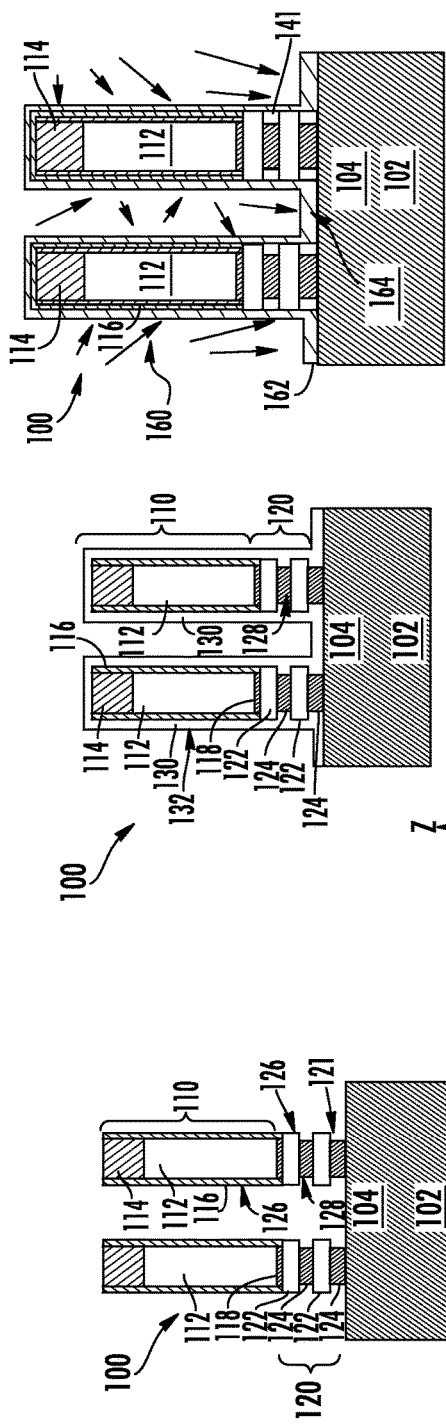
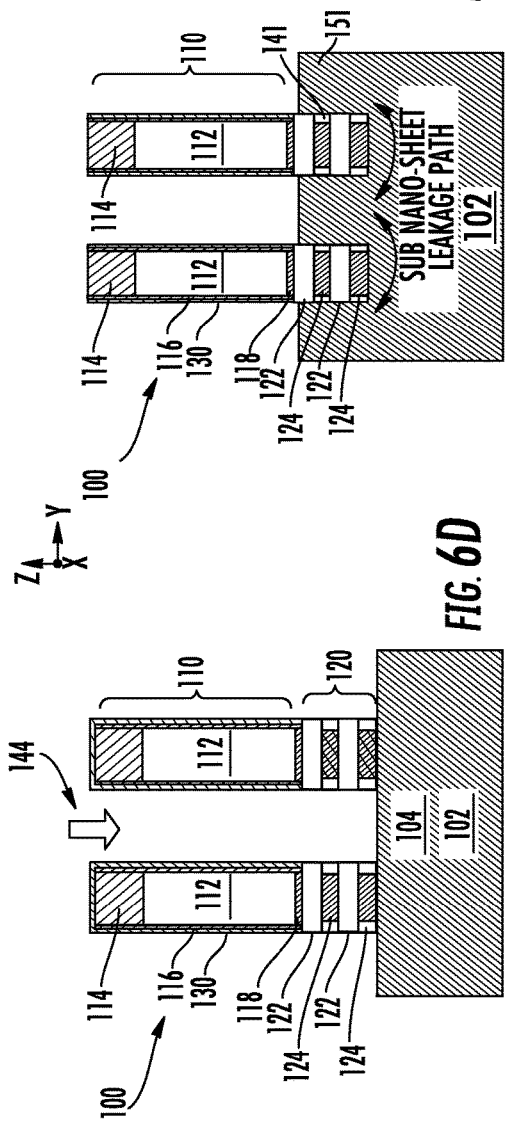

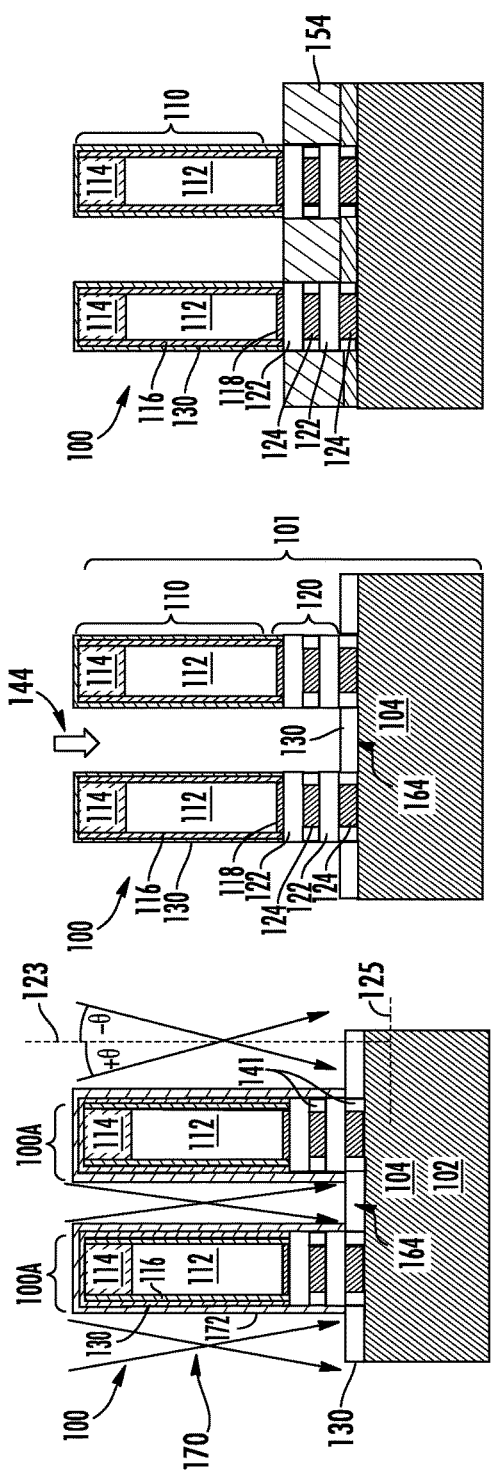
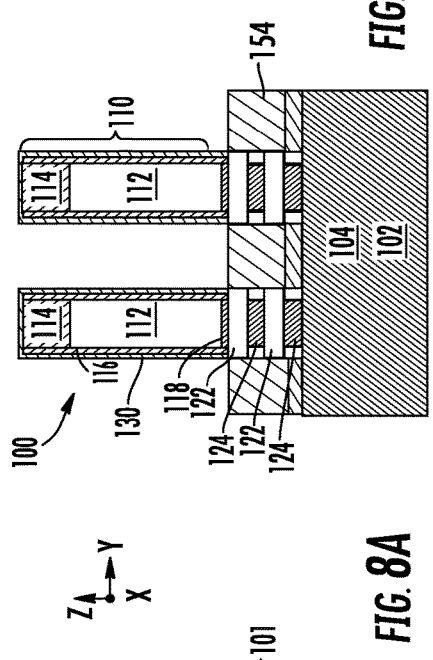
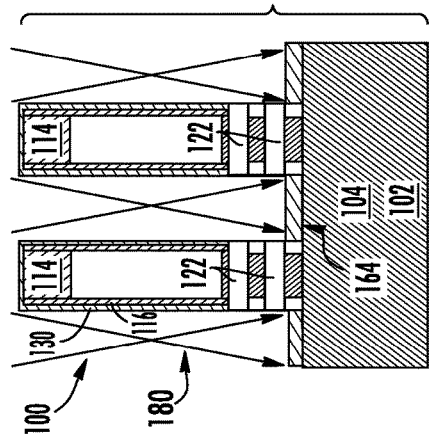
FIG. 7A
FIG. 7B
FIG. 7C
FIG. 8A
FIG. 8B

TECHNIQUES FOR IMPROVED SPACER IN NANOSHEET DEVICE

FIELD

The present embodiments relate to semiconductor device structures, and more particularly, to structures and processing for three dimensional transistor devices.

BACKGROUND

As semiconductor devices scale to smaller dimensions, the ability to harness device improvements with decreased size becomes more challenging. The synthesis of three-dimensional semiconductor transistors, such as fin type field effect transistors (finFET), or horizontal gate all around (HGAA) transistor devices involves challenging processing issues. HGAA structures are often referred to as a nanosheet device because the HGAA transistor formation entails formation of multilayers of nanometer-thick sheets of two different semiconductor materials grown in an epitaxial heterostructure, such as a stack of alternating silicon and silicon:germanium alloy (SiGe) layers, arranged in a vertical configuration. During one stage of formation, the nanosheet device is patterned into nanowire stacks, wherein the SiGe layers in the nanowire stack act as dummy wires, subsequently removed at later stages of processing to form free-standing silicon nanowires. The silicon nanowires can then be encased on four sides with gate material to form an HGAA structure. In known approaches, an epitaxial source drain is to be formed on the Si nanowires in a nanowire stack before the removal of SiGe dummy wires. This sequence entails protection of the SiGe dummy nanowires to ensure the epitaxial source/drain does not grow on the SiGe dummy nanowires, to facilitate removal of the SiGe dummy nanowires at a later stage. One unmet challenge for forming robust nanosheet devices is the ability to form insulating spacers in a controllable fashion, to passivate the SiGe layers in a nanowire stack, preventing epitaxial growth on the SiGe nanowires, while at the same time exposing the silicon nanowires for epitaxial growth thereon.

With respect to these and other considerations, the present disclosure is provided.

BRIEF SUMMARY

In an embodiment a method of forming a three-dimensional transistor device may include providing a substrate comprising a semiconductor device structure, the semiconductor device structure comprising a nanowire stack, a gate stack disposed above the nanowire stack, and an inner spacer layer, disposed over the gate stack and the nanowire stack. The method may further include directing ions at the semiconductor device structure, wherein an altered layer is formed in a first part of the inner spacer layer, and an unaltered portion of the inner spacer layer remains, subjacent to the altered layer.

In a further embodiment, a method of forming a three-dimensional transistor device may include providing a substrate comprising a semiconductor device structure, the semiconductor device structure comprising a nanowire stack, a gate stack disposed above the nanowire stack, and an inner spacer layer, disposed over the gate stack and the nanowire stack. The nanowire stack may include a plurality of nanowires, comprising a first semiconductor material; and a plurality of dummy nanowires, comprising a second semiconductor material, and interspersed with the first plurality of nanowires. The method may include directing angled ions at the semiconductor device structure, wherein the angled ions comprise an angle of incidence with respect to a perpendicular to a plane of the substrate. As such, the inner spacer layer may be removed adjacent the plurality of nanowires, wherein the inner spacer layer remains adjacent to the plurality of dummy nanowires.

In another embodiment, a method of forming a three-dimensional transistor device may include providing a substrate comprising a plurality of semiconductor device structures. A given semiconductor device structure of the plurality of semiconductor device structures may include a nanowire stack, a gate stack disposed above the nanowire stack, and an inner spacer layer, disposed over the gate stack and the nanowire stack. The nanowire stack may include a plurality of nanowires, comprising a first semiconductor material; and a plurality of dummy nanowires, comprising a second semiconductor material, and interspersed with the plurality of nanowires. The method may further include directing angled ions at the semiconductor device structure, wherein the angled ions comprise an angle of incidence with respect to a perpendicular to a plane of the substrate. As such, the angled ions may be implanted into the inner spacer layer in a side region, adjacent the nanowire stack, wherein the angled ions do not implant into the inner spacer layer in a trench region, between adjacent semiconductor device structures.

BRIEF DESCRIPTION OF THE DRAWINGS

FIG. 1A to FIG. 1D depict side different cross-sectional views of a semiconductor device structure, at one stage of fabrication, according to embodiments of the disclosure;

FIG. 1E depicts a top plan view of one embodiment of the device structure of FIGS. 1A-1D, with various details omitted, illustrating the location of the cross-sectional views of FIG. 1A to FIG. 1D;

FIG. 2A to FIG. 2D depict respective side cross-sectional views of the semiconductor device structure of FIG. 1A to FIG. 1D, at another stage of fabrication;

FIG. 3A to FIG. 3D depict respective side cross-sectional views of the semiconductor device structure of FIG. 1A to FIG. 1D, at another stage of fabrication;

FIG. 4A to FIG. 4D depict respective side cross-sectional views of the semiconductor device structure of FIG. 1A to FIG. 1D, at another stage of fabrication;

FIG. 5A to FIG. 5D depict respective side cross-sectional views of the semiconductor device structure of FIG. 1A to FIG. 1D, at another stage of fabrication;

FIG. 6A to FIG. 6E depict various stages of formation of a semiconductor device structure, according to further embodiments of the disclosure;

FIG. 7A to FIG. 7C depict various stages of formation of a semiconductor device structure, according to additional embodiments of the disclosure;

FIG. 8A to FIG. 8B depict various stages of formation of a semiconductor device structure, according to further embodiments of the disclosure;

DETAILED DESCRIPTION

Figure 9:
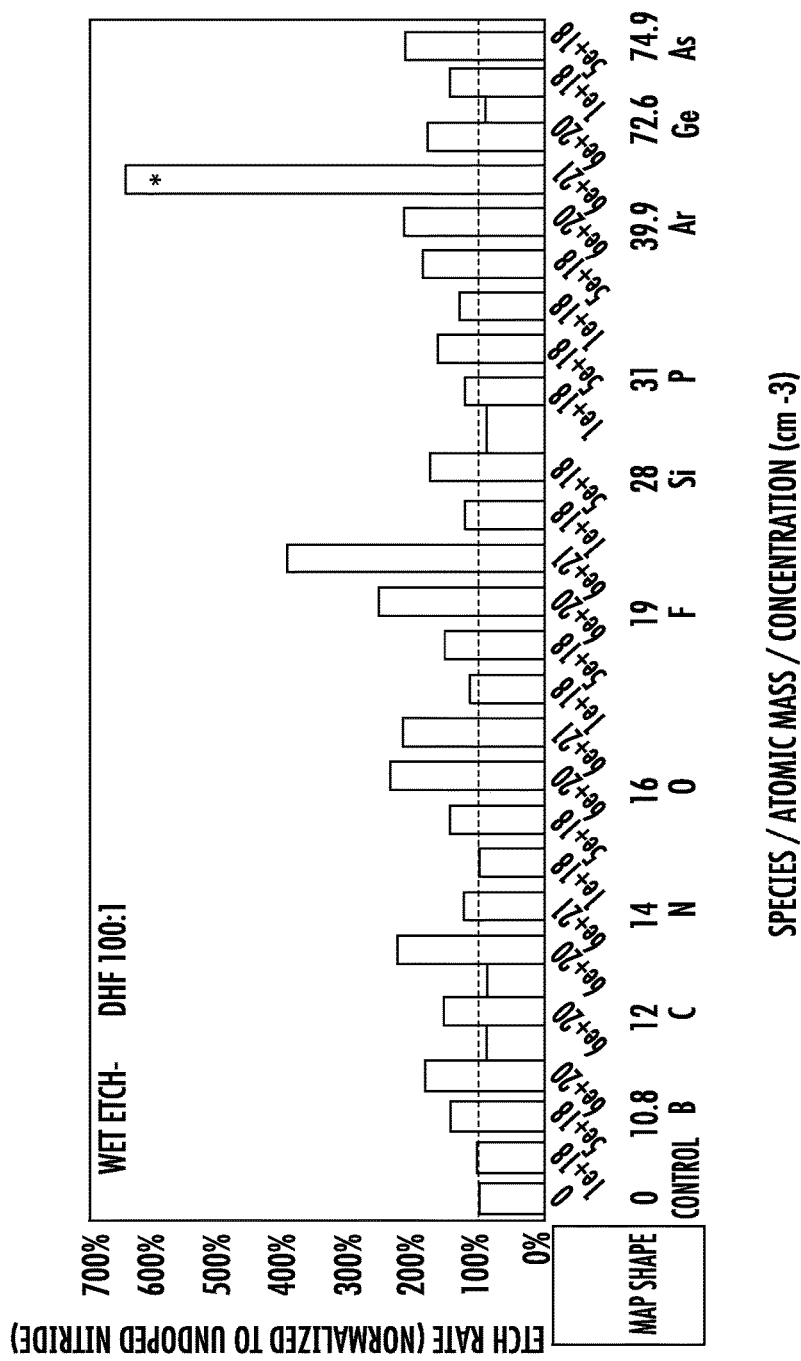
FIG. 9 presents exemplary data illustrating etch rate enhancement using techniques in accordance with embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to form semiconductor devices, including three-dimensional transistors, formed in a semiconductor substrate. As is known, three dimensional transistors, such as HGAA transistors, may be arranged in circuitry to form various types of logic devices, as well as memory devices. An HGAA structure implemented in a CMOS architecture may be referred to herein as a "CMOS nanosheet device" where the CMOS nanosheet device includes both NFET and PFET transistor regions, arranged in stacks of semiconductor nanowires. Such stacks may be referred to herein as nanowire stacks, where a nanowire stack of a first polarity may be a P-type nanowire stack, and a nanowire stack of a second polarity may be an N-type nanowire stack.

Turning now to FIG. 1A to FIG. 1D there are shown different side cross-sectional views of a semiconductor device structure 100, at one stage of fabrication, according to embodiments of the disclosure. FIG. 1E depicts a top plan view of one embodiment of the device structure of FIGS. 1A-1D, with various details omitted, illustrating the location of the cross-sectional views of FIG. 1A to FIG. 1D. The cut along the A-A section of FIG. 1A illustrates the structure of the semiconductor device structure 100 along an active P-type region, intersecting two adjacent gate regions. The cut along the B-B section of FIG. 1B is parallel to the A-A cut, while located off the active regions, along isolation structures. The cut along the C-C section of FIG. 1C is located along a gate structure, orthogonal to the A-A cut, intersecting two different active regions, a PFET region, and an NFET region, as shown. The cut along the D-D section is parallel to the C-C section and intersects two active regions, while not along a gate. The same convention shown in FIG. 1E as described with respect to FIGS. 1A-1D also applies to the various views of the respective FIGS. 2A-2D, 3A-3D, . . . 5A-5D to follow.

The semiconductor device structure 100 may be formed in a substrate 101 (FIG. 1C) and may include a plurality of semiconductor device structures 100A, where a given semiconductor device structure 100A includes a nanowire stack 120, as well as a gate stack 110, disposed over the nanowire stack 120. The gate stack 110 and nanowire stack 120 may be formed according to known techniques and materials, to serve as the basis for an HGAA device to be formed. As shown in FIG. 1A, the gate stack 110 may include a dummy gate 112, capped on an upper surface by cap layer 114, such as silicon nitride (SiN), and a gate sidewall layer 116, which layer may also be a silicon nitride or other known material. In various embodiments, the dummy gate 112 may be formed of polysilicon or other material, to be subsequently removed.

At this stage of fabrication, the nanowire stack 120 may include a plurality of nanowires, shown as nanowires 122, comprising a first semiconductor material. The nanowires 122 may be monocrystalline silicon in some embodiments. The nanowire stack 120 may also include and a plurality of dummy nanowires, shown as dummy nanowires 124, and comprising a second semiconductor material, interspersed with the nanowires 122. The dummy nanowires 124 may be SiGe, where SiGe/Si layers is grown in a heteroepitaxial layer stack according to known processes. At this stage, the gate stack 110 has been patterned and etched down to underlying substrate structures, including the substrate base 102 and raised portion 104, which substrate features may be formed of monocrystalline semiconductor, such as silicon. As such, the dummy nanowires 124 and nanowires 122 are exposed on their sides, as shown in FIG. 1A. The semiconductor device structure 100 may also include an insulator layer 118, separating the gate stack 110 from the nanowire stack 120, as in known HGAA device approaches. As further shown in FIG. 1B-1D, an insulator layer 106 has been formed between raised portions 104, consistent with known fabrication approaches.

Turning to FIG. 2A, FIG. 2B, FIG. 2C, and FIG. 2D, there is shown a subsequent instance, after selective etching has been performed to selectively indent the dummy nanowires 124 with respect to the nanowires 122. The selective etching may be performed using a known etchant for etching SiGe at a faster rate than Si. In some examples, the Ge content of the dummy nanowires may exceed 20%, for example 30%, where etching of an alloy of SiGe having 30% Ge may proceed much faster than etching of pure silicon. As a result, the dummy nanowires may be recessed by one nanometer, two nanometers, three nanometers, five nanometers, or similar amount, where the initial width of the nanowire stack 120 (along the Y-axis of the Cartesian coordinate system shown) may be on the order of 20 nm, 30 nm, 50 nm, or greater. Said differently, the recess 121, formed by selective etching of the dummy nanowires 124, may render the sidewall 128 of the dummy nanowires displaced inwardly with respect to the sidewall 126 of the nanowires 122, by one nanometer, two nanometers, three nanometers or more.

The configuration of FIG. 2A allows formation of a spacer layer within the recess 121 to protect and passivate the dummy nanowires 124, as needed for subsequent epitaxial source/drain growth. Turning now to FIG. 3A, FIG. 3B, FIG. 3C, and FIG. 3D, there is shown a subsequent instance after the deposition of a layer over the structure of FIGS. 2A-2D. The layer is referred to herein as an inner spacer layer, such as inner spacer layer 130. The inner spacer layer 130 may be deposited by a known blanket deposition process, and may be an insulator material, such as silicon nitride. The thickness of the inner spacer layer 130 may be chosen to fill the recess 121 as shown in FIG. 2A, for example, and accordingly is referred to as an inner spacer layer. Non-limiting examples of appropriate thickness for the inner spacer layer 130 are between 2 nm and 10 nm. As such, the inner spacer layer 130 may also cover the sidewalls of the nanowires 122, as shown in FIG. 2A. Notably, to properly perform an epitaxial source/drain growth operation on the nanowires 122, the inner spacer layer 130 is to be removed from the sidewalls of the nanowires 122, while not removing the inner spacer layer 130 from the sidewalls of the dummy nanowires 124.

Turning now to FIG. 4A, FIG. 4B, FIG. 4C, and FIG. 4D, there is shown a subsequent instance after an operation is performed to direct ions 142 to the semiconductor device structure 100. According to various embodiments, discussed in more detail below, the ions 142 may be provided as directional ions or non-directional ions. As shown in FIG. 4A, an altered layer 140 is formed in a first part of the inner spacer layer 130, such as an outer region of the inner spacer layer 130, extending from the outer surface 132 of the inner spacer layer 130. At the same time, an inner spacer portion 141 of the inner spacer layer 130 remains, subjacent to the altered layer 140. For example, the inner spacer portion 141 may include regions of the inner spacer layer 130, adjacent to the dummy nanowires 124. As detailed below, the extent of the altered layer 140 and an unaltered portion of the inner spacer layer 130 may be precisely controlled by choice of ion species for ions 142, ion energy, ion dose, and geometry of ion trajectories, among other features. According to some embodiments, an unaltered portion of the inner spacer layer 130 may include the inner spacer portion 141, as well as parts of the inner spacer layer 130 disposed in a trench region of a semiconductor device structure.

Turning now to FIG. 5A, FIG. 5B, FIG. 5C, and FIG. 5D, there is shown a subsequent instance after an operation is performed to remove the altered layer 140, such as to selectively etch the altered layer 140, using a suitable etchant, shown as etchant 144. In various embodiments, the etchant may be a suitable wet etchant, or a dry etchant, such as a plasma etchant. As such, the altered layer 140 may be removed in regions adjacent to the sides of the nanowires 122, exposing the nanowires 122 as shown in FIG. 5A. For example, in the operation of FIG. 4A, the ions 142 may generate an altered layer 140 extending to the sides of the nanowires 122 or close to the sides of the nanowires (such as within one nanometer or two nanometers), where the altered layer 140 may be readily etched using etchant 144 all the way to the side surface of the nanowires (the X-Z surface). At the same time, the inner spacer portion 141 may serve as an etch stop, where etch rate drastically slows down after the overlying layer, altered layer 140, is removed. Thus, the inner spacer portion 141, or a large fraction of the inner spacer portion 141 may remain after the operation of FIG. 5A, protecting the dummy nanowires 124. As such, the structure of FIG. 5A provides a template for source/drain growth on the nanowires 122 using known epitaxial processes. By ensuring preservation of insulator material adjacent the dummy nanowires 124 while at the same time removing insulator form the sides of nanowires 122, the above approach provides a means for realizing a robust HGAA process and device structure. As further shown in FIG. 5A and FIG. 5B, and depending upon the exact nature of the treatment by ions 142, the inner spacer layer 130 may or may not remain in the trench regions 164, between adjacent semiconductor device structures.

Turning now to FIG. 6A to FIG. 6E there are shown various stages of formation of a semiconductor device structure, according to further embodiments of the disclosure. In this example, the perspective for FIGS. 6A-6E is represented by the A-A section of FIG. 1E. The operations of FIG. 6A and FIG. 6B may proceed similarly to the operations of FIG. 2A and FIG. 3A, discussed above. At FIG. 6C the operation is performed of directing the ions 160 to the semiconductor device structure 100, where the ions 160 may be provided as non-directional ions. In other words, the ions 160 exhibit trajectories not mutually parallel to one another, and may impinge upon the substrate 101 over a wide range of angles, striking various surfaces, including the trench region 164 between adjacent semiconductor device structures. In one embodiment, the substrate 101 may be provided in a plasma deposition (PLAD) apparatus, where the substrate 101 is immersed in a plasma chamber. The substrate 101 may be biased at an appropriate voltage with respect to a plasma to impart a designed ion energy into the ions 160. The ions 160 may exit the plasma and strike the substrate 101 with sufficient energy to implant into the inner spacer layer 130, forming the altered layer 162. In this example, because at least a portion of the ions 160 may have trajectories striking the trench region 164, the altered layer 162 may also form in the trench region 164, as shown.

At FIG. 6D, a subsequent instance is shown after the treatment with etchant 144, discussed above. In this example, the altered layer 162 has been removed from the sides of the nanowires 122, as generally discussed with respect to FIG. Because the altered layer 162 was formed in the trench region 164, the inner spacer layer 130 may no longer be in place above the raised portion 104 of the substrate 101. At FIG. 6E, there is shown a subsequent instance where an epitaxial source/drain 154 has been grown on the nanowires 122. Notably, because the inner spacer layer 130 remains in the inner spacer portion 141, the dummy nanowires are isolated from the epitaxial source/drain 154. Thus, the inner spacer portion 141 may be used to prevent epitaxial growth from SiGe regions and to define S/D extension regions in transistor devices to be formed from the semiconductor device structure 100.

While the above approach may facilitate a robust process for ensuring the inner spacer layer 130 is in place next to the dummy nanowires 124 and is removed next to the nanowires 122, the removal of inner spacer layer 130 from the trench regions 164 results in the epitaxial source/drain 154 growing directly on the raised portions 104. This configuration may subject the device thus formed to unwanted leakage to the substrate base 102. In additional embodiments of the disclosure, this issue is addressed by novel angled ion treatments, as discussed below. Turning now to FIG. 7A to FIG. 7C there are shown various stages of formation of a semiconductor device structure, according to further embodiments of the disclosure. In this example, the perspective for FIGS. 7A-7C is represented by the A-A section of FIG. 1E. The operation in FIG. 7A takes place after the operation of FIG. 6B, discussed above.

In FIG. 7A angled ions 170 are directed to the semiconductor device structure 100, wherein the angled ions 170 exhibit trajectories having an angle of incidence with respect to a perpendicular 123 to a plane of the substrate, shown as plane 125. The plane 125 may be the X-Y plane where the semiconductor device structures 100A extend above the plane 125, and may be characterized by a height along the Z-axis, and a spacing along the Y-axis, between adjacent ones of the semiconductor device structures 100A. As such, the angle of incidence, shown as θ, may be set so angled ions 170 strike the lower portions of the sides (X-Z plane) of the semiconductor device structures 100A, to ensure an altered layer 172 is formed adjacent the nanowires 122, as shown. In addition, the angle of incidence may be set so the angled ions 170 do not implant into the inner spacer layer 130 in the trench region 164, allowing the inner spacer layer 130 to remain in unaltered form, and accordingly form an unaltered portion in the trench regions 164. Suitable apparatus to perform the operation of FIG. 7A include known beamline ion implanters, compact plasma beam sources, where an angled ion beam may be extracted from a plasma chamber and directed to a substrate in an adjacent process chamber, or any suitable ion beam source. In some embodiments, the angled ions 170 may be provided at two different directions with respect to the semiconductor structures 100A. For example, the angled ions 170 may be directed along a fixed trajectory, where in a first position, the angled ions define an angle +θ. Subsequently, the substrate may be rotated 180 degrees so the angled ions 170 define an angle of incidence, −θ. In other embodiments, an ion source or the substrate 101 may be tilted with respect to one another in two different exposures to expose the substrate to ions oriented at +θ and −θ, as shown. In other embodiments, the angled ions may be extracted from a compact plasma source as a pair of opposing ion beams defining the angles +θ and −θ. In various embodiments, the absolute value of +θ and −θ may be equal. The embodiments are not limited in this context.

At FIG. 7B, a subsequent instance is shown after subjecting the substrate to the etchant 144 to selectively remove the altered layer 172. Notably, because the inner spacer layer 130 remains unaltered in the trench region 164 after the instance of FIG. 7A, and therefore has a slower etch rate, at least a part of the inner spacer layer 130 may accordingly remain in the trench region 164 after being subjected to the etchant 144.

At FIG. 7C, there is shown a subsequent instance where an epitaxial source/drain 154 has been grown on the nanowires 122. Notably, because the inner spacer layer 130 remains in the inner spacer portion 141, the dummy nanowires are isolated from the epitaxial source/drain 154. Thus, the inner spacer portion 141 may prevent epitaxial growth from SiGe regions and also may define S/D extension regions in transistor devices to be formed from the semiconductor device structure 100. Additionally, the epitaxial source/drain 154 is isolated from the nanowires 122 by the presence of the inner spacer layer 130. Thus, leakage from the semiconductor device structures 100A to the substrate base 102 may be reduced or avoided in comparison to the embodiment of FIG. 6E.

Turning now to FIG. 8A to FIG. 8B there are shown various stages of formation of a semiconductor device structure, according to further embodiments of the disclosure. In this example, the perspective for FIGS. 8A-8B is represented by the A-A section of FIG. 1E. The operation in FIG. 8A takes place after the operation of FIG. 6B, discussed above. In this embodiment, angled ions 180 are directed to the substrate 101 at an angle of incidence with respect to a perpendicular to a plane of the substrate, as shown, wherein the inner spacer layer 130 is removed adjacent the nanowires 122, and wherein the inner spacer layer 130 remains adjacent to the dummy nanowires 124. Like the embodiment of FIG. 7A, in this embodiment the angle of incidence, shown as θ, may be set so angled ions 180 strike the lower portions of the sides (X-Z plane) of the semiconductor device structures 100A. In addition, the angle of incidence may be set so the angled ions 180 do not strike the inner spacer layer 130 in the trench region 164, allowing the inner spacer layer 130 to remain in unaltered form in the trench regions 164. Unlike the embodiment of FIG. 7A, the angled ions 180 may be provided in a reactive ion mixture, such as a suitable gas mixture to reactively etch material of the inner spacer layer 130. For example, in embodiments where the inner spacer layer 130 is silicon nitride, the angled ions 180 may be provided in a suitable known mixture to reactively etch silicon nitride. Suitable apparatus to perform the operation of FIG. 8A include compact plasma beam sources, where an angled ion beam may be extracted from a plasma chamber and directed to a substrate in an adjacent process chamber, or any suitable reactive ion beam apparatus capable of providing angled ions.

At FIG. 8B, there is shown a subsequent instance where an epitaxial source/drain 154 has been grown on the nanowires 122. Notably, because the inner spacer layer 130 remains in the inner spacer portion 141, the dummy nanowires are isolated from the epitaxial source/drain 154. Thus, the inner spacer portion 141 may remain in place to block lateral etch of SiGe during a subsequent wire release process. Additionally, the epitaxial source/drain 154 is isolated from the nanowires 122 by the presence of the inner spacer layer 130. Thus, leakage from the semiconductor device structures 100A to the substrate base 102 may be reduced or avoided in comparison to the embodiment of FIG. 6E.

Turning now to FIG. 9, there is shown a graph depicting etch rate for different altered layers based upon an inner spacer layer formed from silicon nitride (having an initial SiN thickness of 200 nm), including exemplary conditions for generating an altered layer, in accordance with various embodiments of the disclosure. Specifically, FIG. 9 presents the results for etching of an implanted silicon nitride layer using an etchant composed of a DHF solution of 100:1 $H_2O$:HF solution. Such a solution may be appropriate for a selective etch to remove the as described above. The etch rate is expressed as a percentage of a reference etch rate for a silicon nitride layer, shown as 100%. The results for various ion species including ions formed from relatively lighter elements, such as nitrogen, oxygen and fluorine, and ions formed from relatively heavier elements, including phosphorous, argon, and arsenic. The composition of the altered silicon nitride liner layer is expressed as a function of concentration of the implanted species (implant species). The concentration of implanted species may be achieved by adjusting the ion dose and ion energy, taking into account layer thickness of an inner spacer layer, such as a silicon nitride layer. As an example, the data for argon implantation yielding a concentration of $6E21/cm^3$ is obtained by performing a series of three implantations: 1) 50 keV ion energy, $2.5E16/cm^2$ ion dose, 2) 20 keV, $5E15/cm^2$, and 3) 7 keV $2.5E15/cm^2$. Likewise, the data for fluorine implantation yielding a concentration of $6E21/cm^3$ is obtained by performing a series of three implantations: 1) 50 keV energy, 5 $E16/cm^2$ ion dose, 20 keV $1E16/cm^2$, and 7 keV 5 $E15/cm^2$. These values are merely exemplary. Notably, to achieve the same concentration of implanted species for a thinner spacer layer, such as 2 nm SiN, the ion dose and ion energies used for implantation will scale with decreased thickness, and may be much lower than the above examples.

Notably, for oxygen implantation, the etch rate increases to more than 200% the etch rate of unimplanted silicon nitride for a concentration of $6 E20/cm^2$, while the etch rate does not increase further for a concentration of $6E21/cm^2$, exhibiting a value closer to 200% of the unimplanted etch rate. Unexpectedly, for fluorine implantation the etch rate continues to increase up to a value of approximately 400% of the unimplanted etch rate for a concentration of $6 E21/cm^2$. Similarly unexpectedly, for argon implantation the etch rate continues to increase up to a value of at least 650% of the unimplanted etch rate for a concentration of $6 E21/cm^2$. The etch rate enhancement was actually greater than 650% because the etch depth in this sample exceeded the implant range Rp, meaning the etch rate was partially based on an implanted region of the layer. Notably, the ion dose used to achieve a given concentration of implanted species may be tailored according to the thickness of the liner layer, as will be readily appreciated by those of skill in the art. Thus, a 4-nm thick film may use an ion dose of approximately double the ion dose used for a two-nanometer film. Notably, in embodiments, where the thickness of an inner spacer layer is 10 nm or less, a suitable ion energy, with adjustments for ion mass, may be 2 keV, 1 keV, or 500 eV, 200 eV, for example.

Because the present embodiments facilitate implantation of sidewall portions of an inner spacer layer, an altered layer may readily form to a targeted depth within an inner spacer layer, such as 1 nm to 5 nm, so the portions of the inner spacer layer may also be readily removed using an isotropic etch, such as DHF. At the same time other portions of an inner spacer layer, below the implanted depth may remain unaltered and thus unetched, due to the lower etch rate in the unaltered portions. Referring again to FIG. 6A and FIG. 6B, in an example where the initial thickness of the inner spacer layer 130 adjacent the nanowires 122 is 5 nm (FIG. 6A), the operation of FIG. 6B may be performed with a suitable ion species at a suitable ion energy and ion dose, to implant the ions 160 to form the altered layer 162 to a depth (along the Y-axis) of 5 nm. In this example, the entire thickness of the inner spacer layer 130 adjacent the nanowires 122 may be converted to the altered layer 162, facilitating removal by exposure to DHF. At the same time, because the regions of the inner spacer layer 130 adjacent the dummy nanowires 124 lie at more than 5 nm depth from the surface of the inner spacer layer 130, the regions remain in place to define the inner spacer portion 141. Accordingly, once etch removal has proceeded to etch the top 5 nm of the inner spacer layer 130 (now altered layer 162), any additional etching in the inner spacer portion 141 proceeds much more slowly, allowing a selective etch to be designed to completely remove the inner spacer layer 130 while preserving the inner spacer layer 130, where needed.

Figure 10:
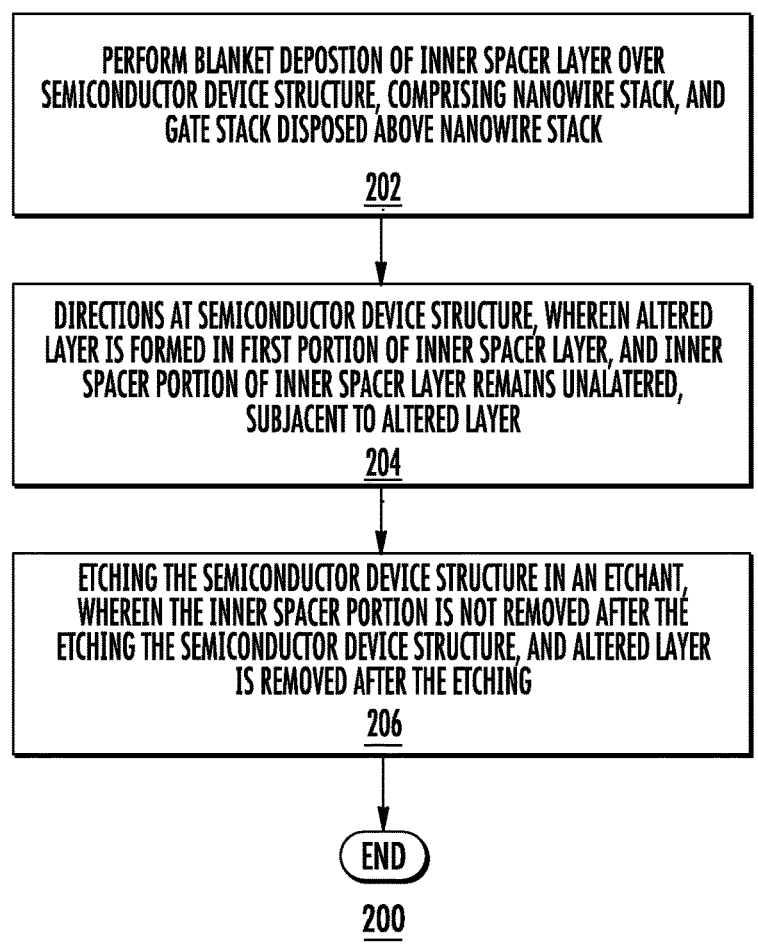
FIG. 10 illustrates an exemplary process flow, according to embodiment of the disclosure.

FIG. 10 depicts an exemplary process flow 200, according to embodiments of the disclosure. At block 202, a blanket deposition of an inner spacer layer is performed to deposit the inner spacer layer over a semiconductor device structure. At the instance of the deposition of the inner spacer layer, the semiconductor device structure may include a nanowire stack and gate stack, disposed over the nanowire stack. The semiconductor device structure may be arranged in a plurality of semiconductor device structures to form HGAA devices. The nanowire stack may include a patterned heteroepitaxial layer stack of alternating nanowires, including silicon nanowires, and dummy nanowires, where the dummy nanowires are composed of a different material than the silicon nanowires, such as SiGe. According to various implementations, the dummy nanowires may be recessed with respect to the silicon nanowires before the deposition of the inner spacer layer.

At block 204 ions are directed at the semiconductor device structure, in a manner where an altered layer is created in the inner spacer layer. The altered layer may, but need not, consume an entire thickness of the inner spacer layer in certain portions, such as in regions adjacent the silicon nanowires. At the same time, in some regions of the inner spacer layer, such as an inner spacer portion adjacent to the recessed dummy nanowires, the inner spacer layer remains unaltered. The inner spacer layer may be implanted with a suitable ion species, including argon, nitrogen, or other species, to create the altered layer. According to some embodiments, the ions may be directed to the semiconductor structure in a non-collimated fashion, over a range of trajectories at different angles of incidence. In other embodiments, the ions may be directed as a collimated flux, where the ions are parallel to one another. The parallel ions may be directed to an array of semiconductor device structures in a manner where the gate stack and nanowire stack of one semiconductor device structure generate shadowing of another semiconductor device structure, as well as regions in between the semiconductor device structures. In this manner, the ions may not strike trench regions between adjacent semiconductor device structures, wherein the inner spacer layer remains unaltered in the trench region.

At block 206, etching is performed of the semiconductor device structure in an etchant, wherein the inner spacer portion is not removed by the etchant, and wherein the altered layer is removed by the etchant. In some examples, the wet etchant may be a wet etchant, wherein the wet etchant is arranged to etch the altered layer at a much faster rate than etching of the unaltered portions of the inner spacer layer. As such, the semiconductor device structure may present exposed silicon nanowires and recessed dummy nanowires covered by a spacer formed from the inner spacer layer.

The present embodiments provide a first advantage where a greater process window is provided to form a spacer in a nanowire stack by using the novel ion treatment of a spacer layer in conjunction with selective etching. Another advantage is the ability to avoid substrate leakage by using directional angled implantation to avoid removing insulator layers above the substrate base.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a three-dimensional transistor device, comprising:
    providing a substrate comprising a semiconductor device structure, the semiconductor device structure comprising a nanowire stack, a gate stack disposed above the nanowire stack, and an inner spacer layer, disposed over the gate stack and the nanowire stack; and
    directing ions at the semiconductor device structure, wherein an altered layer is formed in a first part of the inner spacer layer, and an unaltered portion of the inner spacer layer remains, subjacent to the altered layer.

2. The method of claim 1, wherein the nanowire stack comprises:
    a plurality of nanowires, comprising a first semiconductor material; and
    a plurality of dummy nanowires, comprising a second semiconductor material, and interspersed with the plurality of nanowires, wherein the inner spacer layer comprises an inner spacer portion, adjacent the plurality of dummy nanowires, where the unaltered portion of the inner spacer layer comprises the inner spacer portion.

3. The method of claim 2, further comprising etching the semiconductor device structure in an etchant, wherein the inner spacer portion is not removed after the etching the semiconductor device structure, and wherein the inner spacer layer is removed from a region adjacent the plurality of nanowires.

4. The method of claim 3, further comprising growing an epitaxial source/drain region on the plurality of nanowires.

5. The method of claim 1, further comprising etching the semiconductor device structure in an etchant, wherein the altered layer is etched at a first etch rate, wherein the unaltered portion is etched at a second etch rate, less than the first etch rate.

6. The method of claim 5, wherein the first etch rate is 200% or greater of the second etch rate.

7. The method of claim 1, wherein the inner spacer layer comprises silicon nitride.

8. The method of claim 1, wherein the inner spacer layer comprises a thickness of 2 nm to 10 nm, wherein the altered layer comprises a thickness of 1 nm to 5 nm.

9. The method of claim 1, wherein the ions comprise oxygen, nitrogen, fluorine, or argon.

10. The method of claim 1, wherein the ions comprise an implant species, a first dose and a first ion energy, wherein after the directing the ions, the altered layer comprises a concentration of the implant species of 5 E20/cm$^3$ to 1 E22/cm$^3$.

11. The method of claim 10, wherein the first ion energy is 200 eV to 2 keV.

12. The method of claim 1, wherein the directing the ions comprises providing the semiconductor device structure in a plasma of a plasma deposition apparatus.

13. The method of claim 1, wherein the substrate comprises a plurality of semiconductor device structures, disposed on a substrate base, the plurality of semiconductor device structures defining a trench region between adjacent semiconductor device structures, wherein the directing the ions comprises implanting angled ions into the inner spacer layer, wherein the angled ions do not implant into the inner spacer layer in the trench region.

14. A method of forming a three-dimensional transistor device, comprising:
providing a substrate comprising a semiconductor device structure, the semiconductor device structure comprising a nanowire stack, a gate stack disposed above the nanowire stack, and an inner spacer layer, disposed over the gate stack and the nanowire stack,
wherein the nanowire stack further comprises a plurality of nanowires, comprising a first semiconductor material; and a plurality of dummy nanowires, comprising a second semiconductor material, and interspersed with the first plurality of nanowires; and
directing angled ions at the semiconductor device structure, wherein the angled ions comprise an angle of incidence with respect to a perpendicular to a plane of the substrate,
wherein the inner spacer layer is removed adjacent the plurality of nanowires, and wherein the inner spacer layer remains adjacent to the plurality of dummy nanowires.

15. The method of claim 14, wherein the directing the angled ions comprises providing the angled ions in a reactive ion etching mixture.

16. The method of claim 14, wherein the substrate comprises a plurality of semiconductor device structures, disposed on a substrate base, the plurality of semiconductor device structures defining a trench region between adjacent semiconductor device structures, wherein the angled ions do not strike the trench region, and wherein the inner spacer layer is not removed from the trench region.

17. The method of claim 16, further comprising, growing an epitaxial source/drain region on the plurality of nanowires, wherein the inner spacer layer remains in the trench region, wherein the plurality of nanowires are electrically isolated from the substrate base.

18. A method of forming a three-dimensional transistor device, comprising:
providing a substrate comprising a plurality of semiconductor device structures, wherein a given semiconductor device structure of the plurality of semiconductor device structures comprising a nanowire stack, a gate stack disposed above the nanowire stack, and an inner spacer layer, disposed over the gate stack and the nanowire stack,
wherein the nanowire stack further comprises a plurality of nanowires, comprising a first semiconductor material; and a plurality of dummy nanowires, comprising a second semiconductor material, and interspersed with the plurality of nanowires; and
directing angled ions at the semiconductor device structure, wherein the angled ions comprise an angle of incidence with respect to a perpendicular to a plane of the substrate,
wherein the angled ions are implanted into the inner spacer layer in a side region, adjacent the nanowire stack, and wherein the angled ions do not implant into the inner spacer layer in a trench region, between adjacent semiconductor device structures.

19. The method of claim 18, wherein the inner spacer layer comprises an inner spacer portion, adjacent the plurality of dummy nanowires, where the angled ions do not implant into the inner spacer portion.

20. The method of claim 19, further comprising etching the semiconductor device structure in an etchant, wherein the inner spacer portion is not removed after the etching the semiconductor device structure, and wherein the inner spacer layer is removed from a region adjacent the plurality of nanowires.

\* \* \* \* \*